United States Patent [19]

Sugahara et al.

[11] Patent Number: 5,006,913
[45] Date of Patent: Apr. 9, 1991

[54] STACKED TYPE SEMICONDUCTOR DEVICE

[75] Inventors: Kazuyuki Sugahara; Shigeru Kusunoki; Takashi Ipposhi, all of Hyogo, Japan

[73] Assignee: Mitsubishi Denki Kabushiki Kaisha, Tokyo, Japan

[21] Appl. No.: 430,402

[22] Filed: Nov. 2, 1989

[30] Foreign Application Priority Data

Nov. 5, 1988 [JP] Japan ............................ 63-279631
Jul. 27, 1989 [JP] Japan ............................ 1-196167

[51] Int. Cl.⁵ ............... H01L 27/02; H01L 29/68; H01L 27/12; H01L 29/10
[52] U.S. Cl. ............... 357/41; 357/23.5; 357/4; 357/23.4; 357/23.6
[58] Field of Search ........... 357/41, 23.5, 23.4, 357/23.6, 4

[56] References Cited

FOREIGN PATENT DOCUMENTS 2595165 3/1986 France .
58-7861 1/1983 Japan .

OTHER PUBLICATIONS

Spring Conference of the Japan Society of Applied Physics, 1984, "Experimental Manufacture of Three Dimensional CMOSIC Having SOI Double Layer Structure by Laser Irradiation".
"BPSG Reflow in MOSLSI", Sep. 1987, pp. 150–164.
Applied Physics Letters by Pandya et al., "Large-area defect-free silicon-on-insulator films by zone-melt recrystallization", Mar. 14, 1988, pp. 901–903.
Patent Abstracts of Japan, vol. 7, No. 186 (E-193)[1331], and JF-A-58 090 762 (Mitsubishi Denki).
Thin Solid Films, vol. 154, Nos. 1–2, pp. 249–255, Lausanne, CH, I. H. Cambell et al., "Germanium-on-insulator structures".
IBM Technical Disclosure Bulletin, vol. 27, No. 12, pp. 7263–7264, New York, U.S., "Process for making device quality silicon and silicol dioxide layers for three-dimensional integrated circuits".

Primary Examiner—Rolf Hille
Assistant Examiner—Wael Fahmy
Attorney, Agent, or Firm—Lowe, Price, LeBlanc, Becker & Shur

[57] ABSTRACT

A field effect transistor is formed as a first semiconductor element on a main surface of a first semiconductor layer (1). An interlayer insulating film (10) constituted by a first insulating layer (101) and a second insulating layer (102) is formed on the first semiconductor element. The first insulating layer (101) is formed of a BPSG film having a glass transition point no higher than 750° C. The second insulating layer (102) is formed of a silicon oxide film having a glass transition point higher than 750° C. and a thickness no less than 2000 Å and no more than 1 μm formed on the first insulating layer (101). A second semiconductor layer (11) is formed on the second insulating layer (102) of the interlayer insulating film (10). The second semiconductor layer (11) is formed to be an island, with the peripheral portions isolated. A field effect transistor as a second semiconductor element is formed in the second semiconductor layer (11). The first insulating layer (101) suppresses stress remained in the second semiconductor layer (11) derived from a difference between coefficient of thermal expansion of the second semiconductor layer (11) and the interlayer insulating film (10). The second insulating layer (102) suppresses lateral distortion generated in the semiconductor layer (11). The characteristics of the second semiconductor element can be improved.

4 Claims, 10 Drawing Sheets

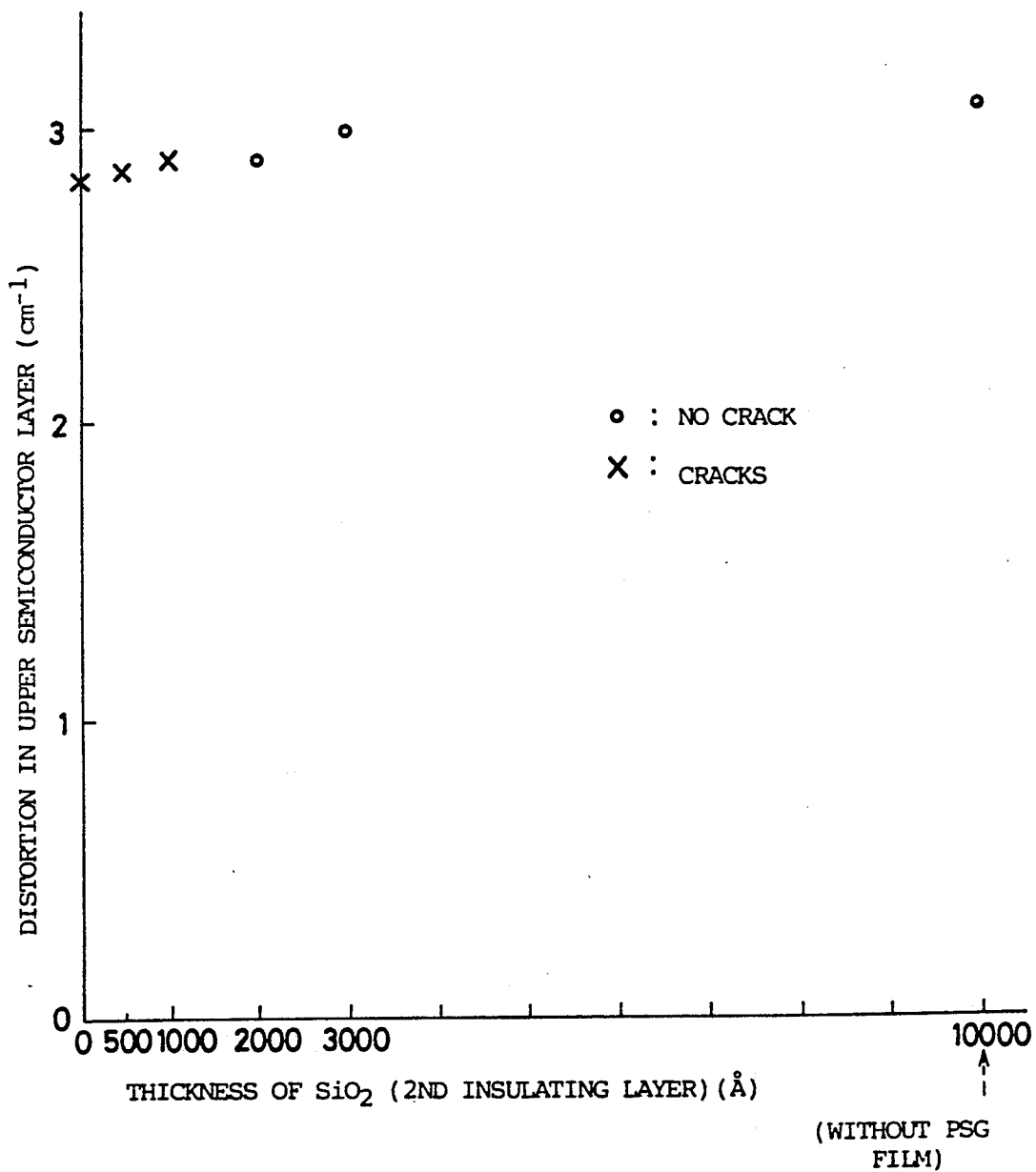

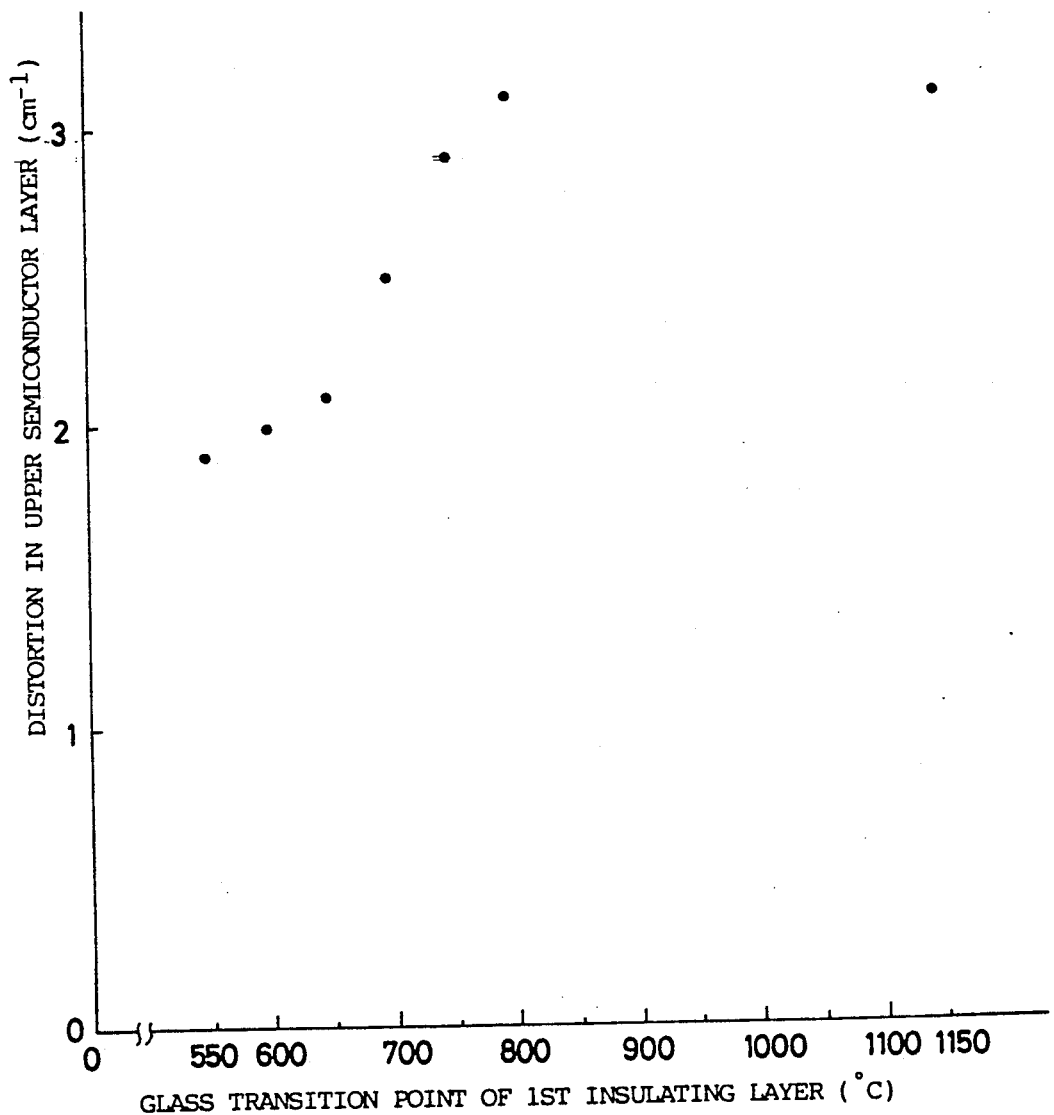

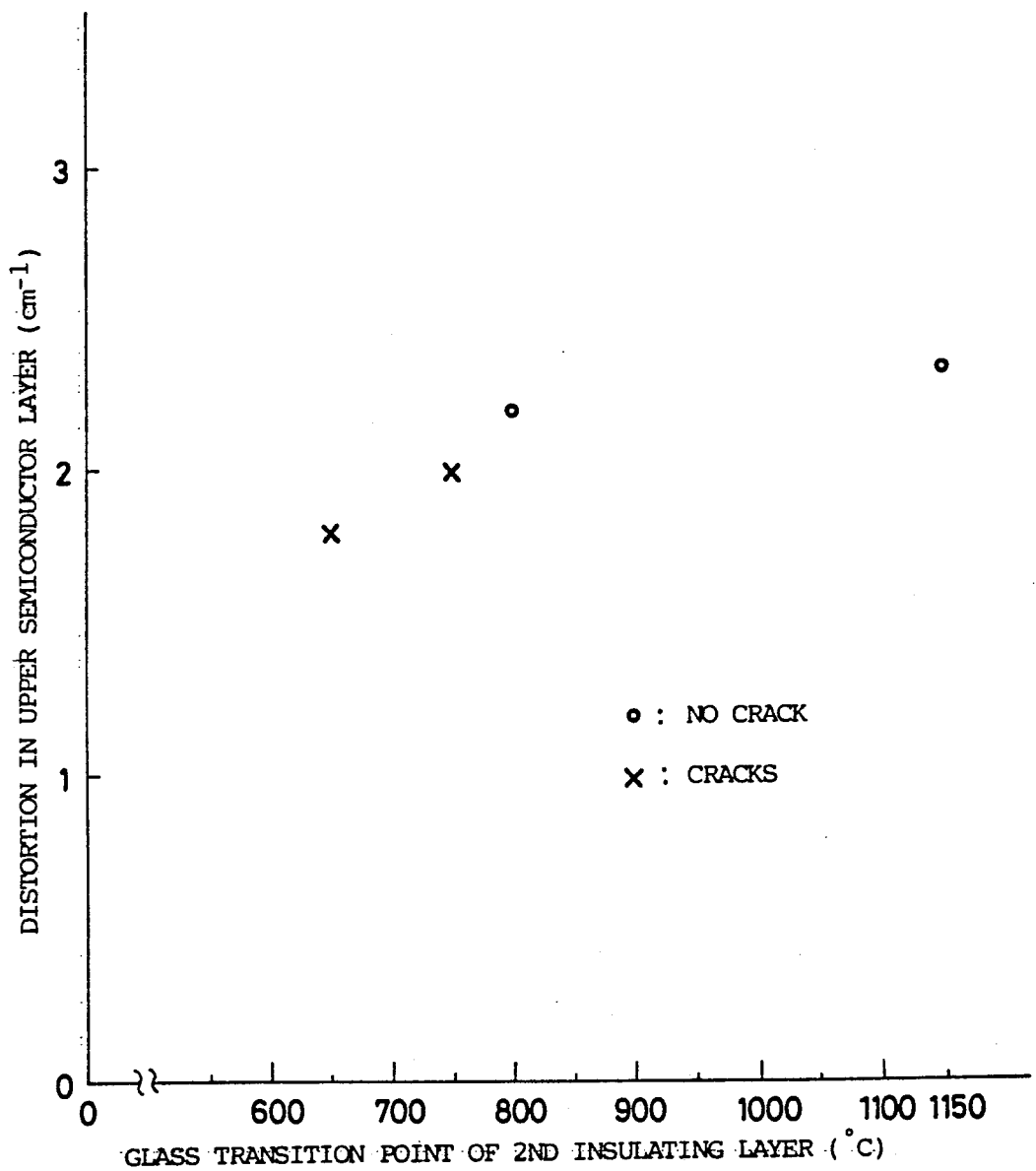

STACKED TYPE SEMICONDUCTOR DEVICE

BACKGROUND OF THE INVENTION

1. Field of the Invention

The present invention relates to stacked type semiconductor devices and manufacturing method therefor. More specifically, the present invention relates to a stacked type semiconductor device in which semiconductor elements are formed in two or more semiconductor layers stacked with interlayer insulating films interposed therebetween, and to the manufacturing method therefor.

2. Description of the Background Art

FIG. 9 is a partial cross sectional view showing a main portion of a conventional stacked type semiconductor device. The structure of the conventional stacked type semiconductor device will be described in the following with reference to FIG. 9.

An isolating oxide film 2 formed of silicon oxide is formed surrounding an element forming region on a main surface of a single crystal silicon substrate (hereinafter referred to as a substrate) 1 of a first conductivity type, for example, p type. A first layer MOS transistor is formed in the element forming region. The first layer MOS transistor comprises a gate electrode 3 and impurity diffused regions 5 and 6 of a second conductivity type, for example, n type, serving as a pair of source-drain regions formed on the main surface of the substrate 1 on both sides of the gate electrode 3. The gate electrode 3 is formed of polycrystalline silicon doped to a high concentration with phosphorous, on a substrate 1 with a gate insulating film 4 interposed therebetween. An insulating layer 7 of silicon oxide film is formed covering the gate electrode 3. First interconnection layers 8 and 9 formed of refractory metal silicide such as tungsten silicide, molybdenum silicide or the like are connected to the impurity diffused regions 5 and 6 serving as source/drain regions, respectively.

An interlayer insulating film 10 is formed over the first layer MOS transistor. The interlayer insulating film 10 is of a silicon oxide film formed by low pressure CVD method (chemical vapor deposition) on the first interconnection layers 8 and 9 and on the insulating layer 7. The interlayer insulating film is about 1.5 to 2μm in thickness. On the interlayer insulating film 10, there is a semiconductor layer 11 having a first conductivity type formed of a single crystal silicon which is an island surrounded by isolating regions 12 of silicon oxide films. The upper semiconductor layer 11 is formed to have an approximately rectangular projected planar shape. A second layer MOS transistor is formed in the upper semiconductor layer 11. The second layer MOS transistor comprises a gate electrode 13 and impurity diffused regions 15 and 16 of the second conductivity type serving as a pair of source.drain regions formed on the main surface of the upper semiconductor layer 11 on both sides of the gate electrode. The gate electrode 13 is formed of polycrystalline silicon doped to a high concentration with phosphorous on the surface of the upper semiconductor layer 11 with a gate insulating film 14 interposed therebetween. An insulating layer 17 formed of silicon oxide film covers the gate electrode 13. Second interconnection layers 18 and 19 are respectively connected to the impurity diffused regions 15 and 16 serving as a pair of source.drain regions. The second interconnection layers 18 and 19 are formed of, for example, aluminum.

In the stacked type semiconductor device structured as described above, the first layer MOS transistor and the first interconnection layers 8 and 9 are separated from the second layer MOS transistor by the interlayer insulating film 10 formed of a silicon oxide film having the thickness of 1.5 to 2.0μm. Instead of the silicon oxide film, a silicon oxide film doped with boron and phosphorus (hereinafter referred to as a BPSG film: boro-phospho silicate glass film) or a silicon oxide film doped with phosphorous (hereinafter referred to as PSG film: phospho silicate glass film) may be used as the interlayer insulating film.

Examples of the conventional stacked type semiconductor devices employing the BPSG film or the PSG film as the interlayer insulating film are disclosed in preceedings of Spring Conference of the Japan Society of Applied Physics 1984, "Experimental Manufacture of Three Dimensional CMOSIC Having SOI Double Layer Structure by Laser Irradiation" and in Japanese Patent Laying Open No. 58-7861. In the former article disclosed is an interlayer insulating film having double layer structure of $Si_3N_4$ film and PSG film. In the latter article, disclosed is an interlayer insulating film having a three layer structure of a silicon oxide film, the PSG film and a silicon oxide film or a silicon nitride film. The silicon oxide film or the silicon nitride film has a low impurity concentration.

In the stacked type semiconductor device shown in FIG. 9, the island-like semiconductor layer 11 serving as a substrate for the second layer MOS transistor is formed by melting and recrystalizing polycrystalline silicon layer formed on the interlayer insulating film 10 by irradiation of energy line such as laser beam on the polycrystalline silicon layer. Namely, the semiconductor layer 11 is once heated to 1420° C., which is the melting point of silicon, and thereafter it is cooled to the room temperature. Meanwhile, the glass transition point of the silicon oxide formed by the CVD method serving as the interlayer insulating film 10 is 1150° C. Therefore, when the semiconductor layer 11 is melted, the interlayer insulating film 10 in contact with the semiconductor layer 11 becomes viscous. The glass transition point means a temperature at which the coefficient of viscosity of a material is $10^{12}$ poise (g/cm$^2$·sec).

The coefficient of thermal expansion of silicon is $5 \times 10^{-6}$/°C., while the coefficient of thermal expansion of the silicon oxide is $5 \times 10^{-7}$/°C. The difference of the coefficient between the two is of the order of one rank. Due to the difference of the coefficient of thermal expansion, a tensile stress of about $10^9$dyne/cm$^2$ remains in the semiconductor layer 11 in the course of melting, recrystalization and cooling to the room temperature of the semiconductor layer 11. The remaining tensile stress causes distortion of the semiconductor layer 11. Consequently, the characteristics of the device such as current handling capability of the second layer MOS transistor formed in the distorted semiconductor layer 11 are degraded. The reason for this may be reduction of mobility of electrons caused by the existence of the remaining tensile stress in the material.

How the tensile stress remains in the semiconductor layer 11 will be described in the following. A polycrystalline silicon layer is formed on the silicon oxide film serving as the interlayer insulating film 10. By the irradiation of energy line such as laser beam on the polycrystalline silicon layer, the polycrystalline silicon layer is melted and recrystalized. On this occasion, the polycrystalline silicon layer is heated to 1420° C. which is the melting point of silicon. Thereafter, the semiconductor layer 11 formed of single crystal silicon formed by recrystalization is cooled to room temperature. In the course of cooling, the interlayer insulating film 10 below the semiconductor layer 11 is also kept in the melt state until it is cooled to 1150° C. which is the glass transition point of silicon oxide. Therefore, the semiconductor layer 11 contracts without restriction by the interlayer insulating film 10. However, when it is cooled further from 1150° C. to the room temperatrure, the interlayer insulating film 10 is in the solid state, so that the semiconductor layer 11 contracts restricted by the interlayer insulating film 10. More specifically, the semiconductor layer 11 is cooled to the room temperature strained by the interlayer insulating film 10. Thus, tensile stress remains in the semiconductor layer 11.

In the foregoing, description was given of two layers of MOS transistors. When three or more MOS transistors are formed, the interlayer insulating film directly below the semiconductor layer of the uppermost MOS transistor becomes thick. For example, the thickness of the interlayer insulating film directly below the MOS transistor of the third layer may be double of the MOS transistor in the second layer. Therefore, the above described problem of distortion in the upper semiconductor layer becomes more serious. When the stress is larger than $10^{10} dyne/cm^2$ which is the yield stress of silicon, there may possibly be a crack in the upper semiconductor layer.

When a BPSG film is used as the interlayer insulating film 10 instead of the silicon oxide film, the distortion generated in the upper semiconductor layer 11 can be reduced to $\frac{1}{3}$ to $\frac{2}{3}$ compared with the case of the silicon oxide film. The reason for this may be the fact that the glass transition point of the BPSG film is 650° C. which is lower than that of the silicon oxide film. More specifically, when the silicon oxide is used as the interlayer insulating film 10, it becomes solid at 1150° C. during cooling of the upper semiconductor layer. Meanwhile, when the BPSG film is used as the interlayer insulating film, it becomes solid at a lower temperature, that is, 650° C., which contributes to the reduction of distortion in the upper semiconductor layer 11.

However, in this type of stacked type semiconductor devices, the width of the semiconductor regions melted by irradiation of energy line is as narrow as 0.1 to 1 mm. The width of this region to be melted is very small compared with the size of the semiconductor substrate (4 inch substrate has a diameter of 100 mm, 6 inch substrate has a diameter of 150 mm). Therefore, distortion is generated between the semiconductor layer which is melted and the semiconductor layer which is not melt, due to the difference of temperature. Consequently, lateral planar distortion remains in the semiconductor layer 11. The distortion of the melt semiconductor layer is reduced by the BPSG film below the semiconductor layer, which BPSG film has its coefficient of viscosity lowered. However, the coefficient of viscosity of the BPSG film below the semiconductor layer which is not melted is not sufficiently reduced to eliminate the distortion at the boundary between the portions which are melted and the portions which are not melted. Therefore, even if the BPSG film is used as the interlayer insulating film 10, the characteristics of the second layer MOS transistor is degraded.

What is disclosed in the above mentioned article and the gazette is an interlayer insulating film having two layers of different materials. There is no consideration of the relation between the semiconductor layer and interlayer insulating film in association with the distortion or crack generated in the semiconductor layer in the course of melting and recrystalizing the upper semiconductor layer formed on the interlayer insulating film.

SUMMARY OF THE INVENTION

An object of the present invention is to provide a stacked type semiconductor device in which distortion generated in a second semiconductor layer formed on the interlayer insulating film can be suppressed.

Another object of the present invention is to provide a stacked type semiconductor device capable of suppressing remaining stress generated in the second semiconductor layer by the difference of coefficients of thermal expansion of the interlayer insulating film and the second semiconductor layer.

A further object of the present invention is to provide a stacked type semiconductor device in which lateral distortion in the second semiconductor layer formed on the interlayer insulating film can be suppressed.

A still further object of the present invention is to provide a stacked type semiconductor device having improved characteristics.

Yet another object of the present invention is to provide a method of manufacturing a stacked type semiconductor device in which distortion generated in the second semiconductor layer formed on the interlayer insulating film can be suppressed.

A still further object of the present invention is to provide a method of manufacturing a stacked type semiconductor device in which a remaining stress generated in the second semiconductor layer by the difference of coefficients of thermal expansion of the interlayer insulating film and the second semiconductor layer can be suppressed.

A still further object of the present invention is to provide a method of manufacturing a stacked type semiconductor device in which lateral distortion of the second semiconductor layer formed on the interlayer insulating film can be suppressed.

A still further object of the present invention is to provide a method of manufacturing stacked type semiconductor device having improved characteristics.

The stacked type semiconductor device in accordance with the present invention comprises a first semiconductor layer, an interlayer insulating film and a second semiconductor layer. The first semiconductor layer has a main surface on which a first semiconductor element is formed. The interlayer insulating film comprises a first insulating layer and a second insulating layer. The first insulating layer is formed on the first semiconductor element and has the glass transition point of 750° C. or lower. The second insulating layer is formed on the first insulating layer and has a glass transition point higher than 750° C. and thickness of no less than 2000Å and no more than 1μm. The second semiconductor layer is formed on the second insulating layer of the interlayer insulating film to be an island with the periphery isolated. The second semiconductor layer has a main surface on which a second semiconductor element is formed.

In accordance with the method of manufacturing the stacked type semiconductor device in accordance with the present invention, a first semiconductor element is formed on the main surface of the first semiconductor layer. A first insulating layer having the glass transition point no higher than 750° C. is formed on the first semiconductor device. A second insulating layer having the glass transition point higher than 750° C. and a thickness no less than 200Å and no more than 1μm is formed on the first insulating layer. A second semiconductor layer is formed on the second insulating layer to be an island with the periphery isolated.

In accordance with the preferred embodiment of the present invention, the first insulating layer comprises a silicon oxide film doped with boron and phosphorus, and the second insulating layer comprises a silicon oxide film. The first and second semiconductor elements are field effect transistors. In accordance with the preferred embodiment of the method of manufacturing the stacked type semiconductor device of the present invention, the step of forming the second semiconductor layer is as follows. First, a hole is formed which has the first and second insulating layers as side surfaces and a portion of the main surface of the first semiconductor layer as a bottom surface. A third insulating layer having the glass transition point higher than 750° C. and a thickness of no less than 2000Å and no more than 1 μm is formed on the side surface of the hole. A single crystal silicon layer is formed on the second and the third insulating layers to fill that hole. The single crystal silicon layer is selectively removed to form an island-like second semiconductor layer.

In the present invention, the interlayer insulating film below the upper semiconductor layer comprises first and second insulating layers. The first insulating layer suppresses the remaining stress generated in the upper semiconductor layer caused by the difference of the coefficients of thermal expansion of the upper semiconductor layer and the interlayer insulating film, and the second insulating layer suppresses the lateral distortion generated in the upper semiconductor layer.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 2 and 3 are graphs showing changes of the distortion in the upper semiconductor layer dependent on the thickness of the second insulating layer;

FIG. 4 is a graph showing a change in the distortion of the upper semiconductor layer dependent on the glass transition point of the first insulating layer;

FIG. 5 is a graph showing a change in distortion of the upper semiconductor layer dependent on the glass transition point of the second insulating layer;

DESCRIPTION OF THE PREFERRED EMBODIMENTS

Figure 1:
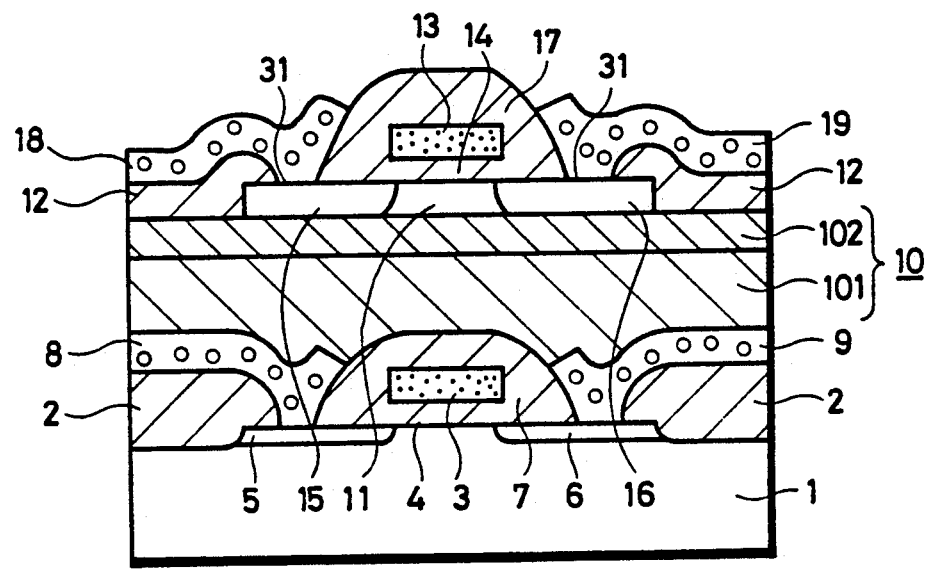
FIG. 1 is a partial sectional view showing one embodiment of the stacked type semiconductor device in accordance with the present invention.

FIG. 1 is a partial sectional view of a main portion of one embodiment of the stacked type semiconductor device in accordance with the present invention. The structure of the stacked type semiconductor device of the present invention will be described with reference to FIG. 1.

An isolating oxide film 2 formed of silicon oxide is formed surrounding an element forming region on a main surface of a silicon substrate 1 having a first conductivity type. A first layer MOS transistor is formed tranisistor comprises a gate electrode 3 and impurity diffused regions 5 and 6 of a second conductivity type serving as a pair of source and drain regions. The gate electrode 3 is formed on the substrate 1 with a gate insulating film 4 interposed therebetween. An insulating layer 7 is formed to cover the gate electrode 3. A first interconnection layers 8 and 9 are formed to be connected to the impurity diffused regions 5 and 6, respectively, which interconnection layers formed of refractory metal silicide. An interlayer insulating film 10 is formed on the first layer MOS transistor structured as described above. The interlayer insulating film 10 comprises a first insulating layer 101 and a second insulating layer 102. The first insulating layer is formed of a silicon oxide film including phosphorous and boron (BPSG) whose glass transition point is 650° C. The BPSG film is a silicon oxide film including 7.5 mol % of phosphorous and 10 mol % of boron in the form of $B_2O_3$. The BPSG film is formed by the normal pressure CVD method. The first insulating layer 101 has a thickness of 1.3 to 1.8μm. The second insulating layer 102 is formed on the first insulating layer 101. The second insulating layer 102 is a silicon oxide film formed by low pressure CVD method whose glass transition point is 1150° C. The second insulating layer 102 has a thickness of 2000Å.

On the interlayer insulating film 10 structured in the above described manner, formed is an upper semiconductor layer 11 having the second conductivity type formed of single crystal silicon which is an island surrounded by isolating region 12 of silicon oxide. A second layer MOS transistor is formed on a main surface of the upper semiconductor layer 11. The second layer MOS transistor comprises a gate electrode 13 and impurity diffused regions 15 and 16 of the first conductivity type serving as a pair of source and drain regions. The gate electrode 13 is formed on the upper semiconductor layer 11 with a gate insulating film 14 posed therebetween. An insulating layer 17 of silicon oxide is formed covering the gate electrode 13. A second interconnection layers 18 and 19 formed of, for example, aluminum are respectively connected to the impurity diffused regions 15 and 16.

In the stacked type semiconductor device structured as described above, the first layer MOS transistor and the first interconnection layers 8 and 9 are electrically isolated from the second layer MOS transistor by means of the interlayer insulating film 10, which contributes to good characteristics of the second layer MOS transistor formed on the upper semiconductor layer.

The semiconductor layer 11 is formed by irradiating polycrystalline silicon with energy line, for example, an argon laser beam with the irradiating output being 10 to 15 W, beam diameter 100 μm and scanning speed 25 cm/sec, so that the polycrystalline silicon is melted and recrystallized. During the step of forming the semiconductor layer 11, the remaining stress in the semiconductor layer 11 can be much reduced and the generation of cracks and like can be prevented. Consequently, the second layer MOS transistor having superior characteristics such as high current handling capability can be formed on the upper semiconductor layer 11.

The following points are considered to be the reason for this. Namely, when the polycrystalline silicon is recrystallized to be the single crystal silicon, the stress derived from the difference between the coefficient of thermal expansion of the semiconductor layer 11 and the interlayer insulating film 10 is absorbed by the first insulating layer 101 having the low glass transition point of 650° C. Consequently, the stress remaining in the semiconductor layer 11 can be suppressed. The lateral distortion generated between the semiconductor layer which is melt and the semiconductor layer which is not melt can be suppressed by the second insulating layer 102.

The inventors experimentally manufactured for study semiconductor devices with the thickness of the interlayer insulating film 10, especially of the second insulating layer 102 and the materials of the first and second insulating layers 101 and 102 changed variously. The results of the experiment will be described in the following.

Figure 2:
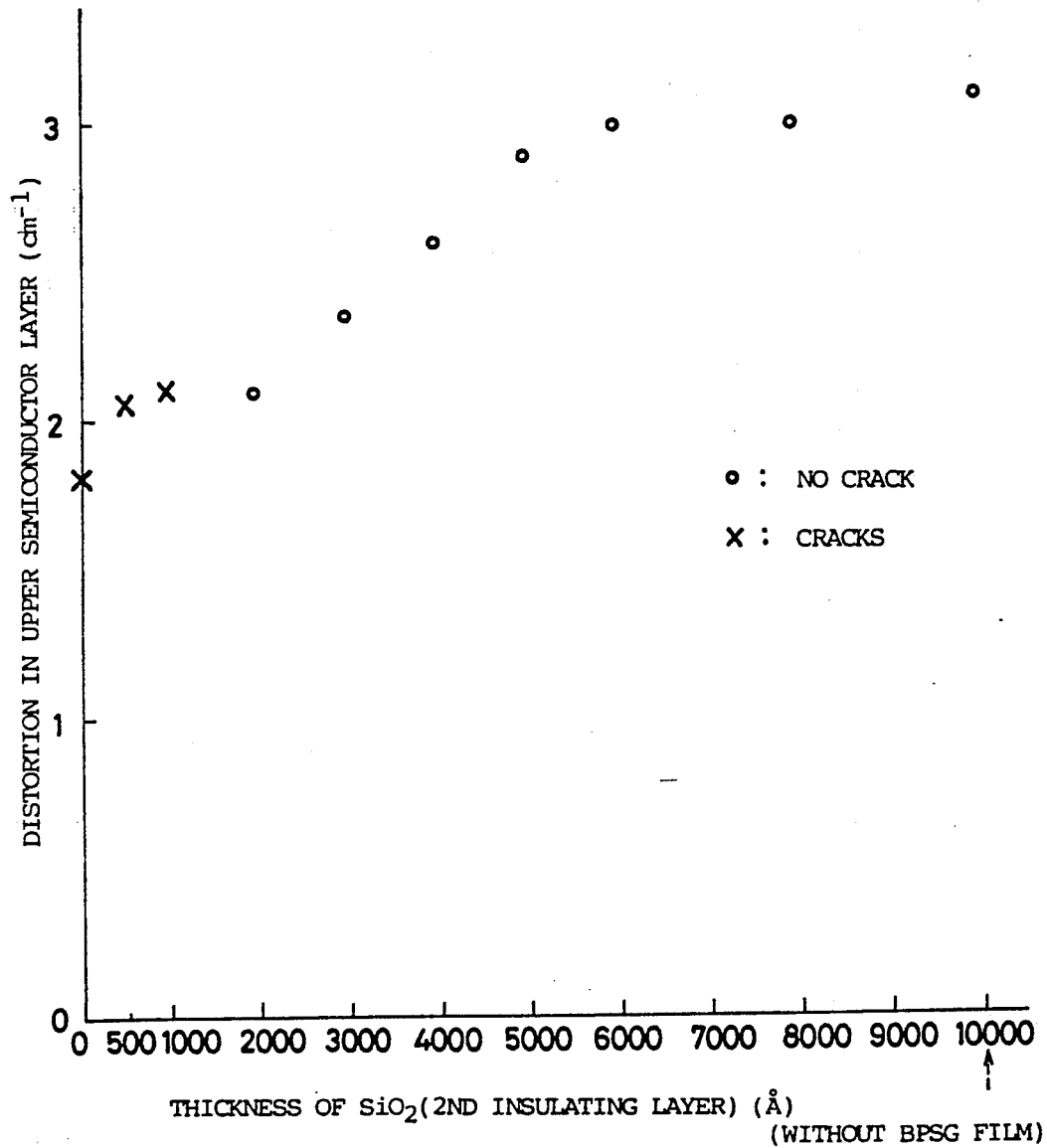

First, devices are formed with the materials of the first and second insulating layers 101 and 102 being the same as that shown in FIG. 1 and the thickness of the second insulating layer 102 changed variously. A BPSG film having the thickness of 10,000Å and the glass transition point of 650° C. is used as the first insulating layer 101, and a silicon oxide film having the glass transition point of 1150° C. is used as the second insulating layer 102 with the thickness thereof changed from 0 to 10,000Å. A polycrystalline silicon having the thickness of 0.5 μm is deposited by the CVD method on the second insulating layer 102. The polycrystalline silicon is irradiated by an argon ion laser beam with the irradiation output being 10 to 15 W, the beam diameter 100 μm and the scanning speed 25 cm/sec. In this manner, the polycrystalline silicon is melted and recrystallized, and thereafter it is annealed for 30 minutes at 900° C. The annealing is the thermal processing corresponding to the thermal oxidation and thermal diffusion of the first semiconductor layer 11. The distortion (stress) of the single crystal silicon layer formed in this manner is measured by microscopic Raman spectroscopy. The result of measurement is shown in FIG. 2 as the distortion of the upper semiconductor layer in FIG. 2. In the figure, the ordinate represents a difference between the Raman peak shift in accordance with the Raman spectroscopy of the single crystal silicon layer formed by the above mentioned irradiation of laser beam and the Raman peak shift of the single crystal silicon of a wafer as grown. 1 cm$^{-1}$ (kayser) corresponds to a stress of about $2\times 10^9$ dyne/cm$^2$. The measurement precision is ±0.05 cm$^{-1}$.

Referring to FIG. 2, when the thickness of the second insulating layer is in the range of 0 to 3000Å, the distortion of the upper semiconductor layer is in the range of 1.8 to 2.3 cm$^{-1}$, which is lower than 3.1 cm$^{-1}$ in the case employing only the silicon oxide film (having the thickness of 10,000Å) with the glass transition point being 1150° C. However, when the recrystalized single crystal silicon layer is further examined, cracks are generated in the single crystal silicon layer serving as the upper semiconductor layer when the thickness of the second insulating layer is 0Å, 500Å or 1000Å. Namely, when the thickness of the second insulating layer is less than 2000Å, cracks are generated in the upper semiconductor layer. Meanwhile, when the thickness exceeds 10,000Å, much stress remains in the upper semiconductor layer, causing degradation of the characteristics of the second layer MOS transistor formed on the upper semiconductor layer. When the thickness of the second insulating layer is in the range of 2000Å to 10,000Å (1 μm), the remaining stress in the upper semiconductor layer is very small and the characteristics of the second layer MOS transistor were superior. When the thickness of the second insulating layer exceeds 1 μm, there is no effect of the first insulating layer and it is approximately the same as the interlayer insulating film formed only on the silicon oxide film having the glass transition point of 1150° C. In addition, stress remains in the upper semiconductor layer. When the thickness of the second insulating layer is less than 2000Å, there is no effect of the second insulating layer and it is approximately the same as the interlayer insulating film formed only of the BPSG film having the glass transition point of 650° C. In addition, lateral distortion is generated in the upper semiconductor layer, causing cracks.

Semiconductor devices are manufactured by using a PSG film in which the silicon oxide film includes 7.5 mol % of phosphorous having the glass transition point of 750Å and a thickness of 10,000Å as the first insulating layer 101 and using a silicon oxide film having the glass transition point of 1150° C. as the second insulating layer 102 with the thickness thereof being changed variously. The method of forming the single crystal silicon layer as the upper semiconductor layer on the second insulating layer is the same as above. The method of measurement of the distortion in the upper semiconductor layer is also the same as above. The relation between the distortion in the upper semiconductor layer and the thickness of the second insulating layer is shown in FIG. 3.

Referring to FIG. 3, when a PSG film having the glass transition point of 750° C. is used as the first insulating layer, the distortion in the upper semiconductor layer is in the range of 2.8 to 3.0 cm$^{-1}$ with the thickness of the second insulating layer being in the range of 0 to 3000Å. The distortion is smaller than that (3.1 cm$^{-1}$) of the insulating film formed only of a silicon oxide film (having the thickness of 10,000Å) with the glass transition point of 1150° C. However, when the recrystalized single crystal silicon layer serving as the upper semiconductor layer is further examined, cracks are generated in the single crystal silicon layer when the thickness of the second insulating layer is 0Å, 500Å or 1000Å. It is understood that the remaining stress is large in the semiconductor layer when the thickness of the second insulating layer is less than 2000Å and when it is thicker than 10,000Å.

Semiconductor devices are formed by using a film having the thickness of 10,000Å as the first insulating layer and a silicon oxide film having the thickness of 3000Å and the glass transition point of 1150° C. as the second insulating layer, with the glass transition point of the first insulating layer changed variously. The single crystal silicon layer as the upper semiconductor layer is formed in the same manner as described above on the second insulating layer. The distortion of the single crystal silicon layer is measured in the same manner as described above. The relation between the distortion in the upper semiconductor layer and the glass transition point of the first insulating layer is shown in FIG. 4. Referring to FIG. 4, the remaining distortion of the upper semiconductor layer becomes larger than 3 cm$^{-1}$ when the glass transition point of the first insulating layer exceeds 750° C. When the glass transition point of the first insulating layer is no more than 750° C., the remaining distortion of the upper semiconductor layer is relatively small. Namely, when the glass transition point of the first insulating layer exceeds 750° C., the distortion is approximately the same in the case in which the interlayer insulating film is formed only of the silicon oxide film having the glass transition point of 1150° C.

The method of forming an insulating layer with various glass transition points is disclosed in "BPSG Reflow in MOSLSI", Semiconductor World, September, 1987, pp. 150 to 164. Insulating layers having differents glass transition points can be provided by changing concentrations of phosphorous and boron as impurities.

Devices are formed by using a BPSG film having the thickness of 10,000Å and the glass transition point of 650° C. as the first insulating layer and a film having the thickness of 3000Å as the second insulating layer with the glass transition point of the second insulating layer changed variously. A single crystal silicon layer as the upper semiconductor layer is formed on the second insulating layer in the same manner as described above. The distortion in the single crystal silicon layer is measured in the same manner as described above. The result of measurement, that is, the relation between the distortion in the upper semiconductor layer and the glass transition point of the second insulating layer is shown in FIG. 5. Referring to FIG. 5, the distortion of the upper semiconductor layer is relatively small. However, when the recrystalized single crystal silicon layer is further examined, cracks are generated in the single crystal silicon layer when the glass transition point of the second insulating layer is no more than 750° C. This suggests a lateral distortion generated in the semiconductor layer. Namely, when the glass transition point of the second insulating layer is no more than 750° C., the characteristic is approximately the same as that of the interlayer insulating film formed only of the BPSG film having the glass transition point of 650° C.

One embodiment of the method of manufacturing the stacked type semiconductor device shown in FIG. 1 will be described. FIGS. 6A to 6I are partial sectional views showing in this order the method of manufacturing the stacked type semiconductor device.

Figure 6A:
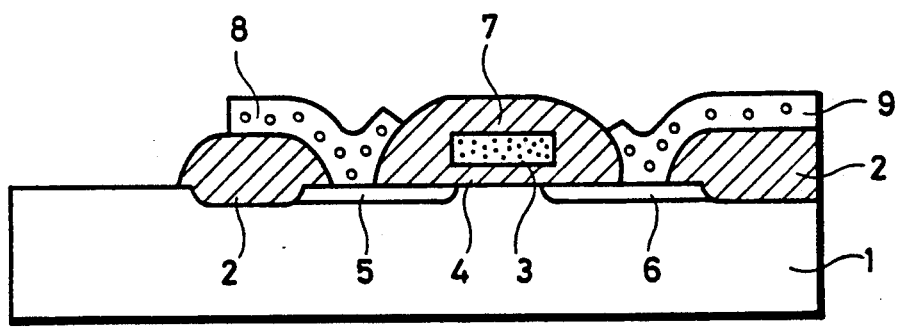
FIGS. 6A, 6B, 6C, 6D, 6E, 6F, 6G, 6H and 6I are partial sectional views showing in this order one embodiment of the method of manufacturing the stacked type semiconductor device in accordance with the present invention.

First, referring to FIG. 6A, isolating oxide films 2 are formed spaced apart from each other to surround an element forming region on a silicon substrate 1. In the element forming region, a first layer MOS transistor comprising a gate electrode 3, a gate insulating film 4 and impurity diffused regions 5 and 6 serving as a pair of source and drain regions is formed. An insulating film 7 of silicon oxide is formed covering the gate electrode 3. First interconnection layers 8 and 9 of refractory metal silicide are formed to be connected to the impurity diffused regions 5 and 6, respectively.

Figure 6B:
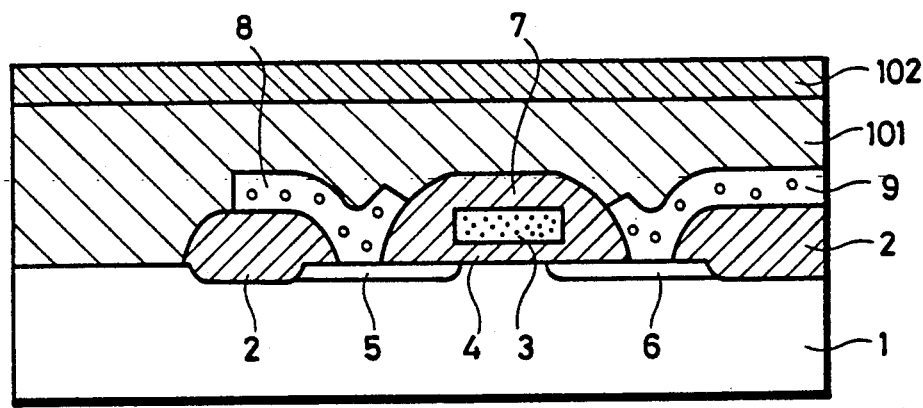

Referring to FIG. 6B, a first insulating layer 101 formed of a BPSG film having the glass transition point of 650° C. and the thickness of 1.3 to 1.8 μm is formed entirely over the main surface of the substrate 1 to cover the first layer MOS transistor. A second insulating layer 102 formed of silicon oxide film having the glass transition point of 1150° C. and the thickness of 2000Å is deposited by low pressure CVD method on the first insulating layer 101.

Figure 6C:
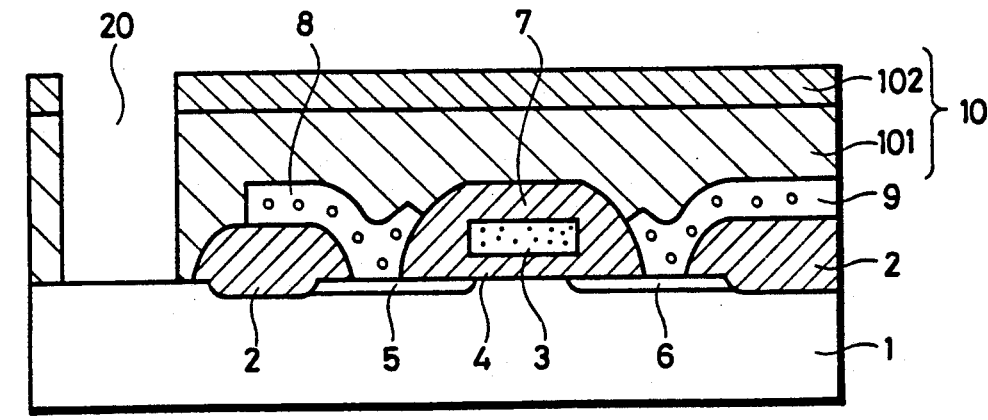

Referring to FIG. 6C, the interlayer insulating film 10 is selectively removed by photolithography and anisotropic etching. Consequently, an opening 20 at which the main surface of the silicon substrate 1 is exposed is formed at a position to be a seed for single crystallization. The size of the opening portion 20 is made larger by 0.4 μm (=2000Å×2) than the necessary designed value as a seed.

Figure 6D:
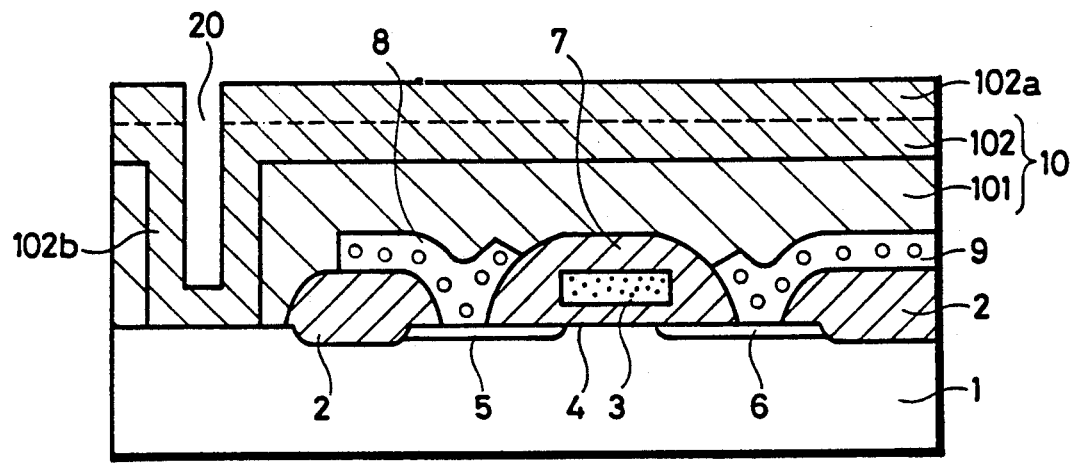

Thereafter, as shown in FIG. 6D, silicon oxide films 102a and 102b are formed by low pressure CVD method on the entire surface, which films have the thickness of 2000Å and the glass transition point of 1150° C.

Figure 6E:
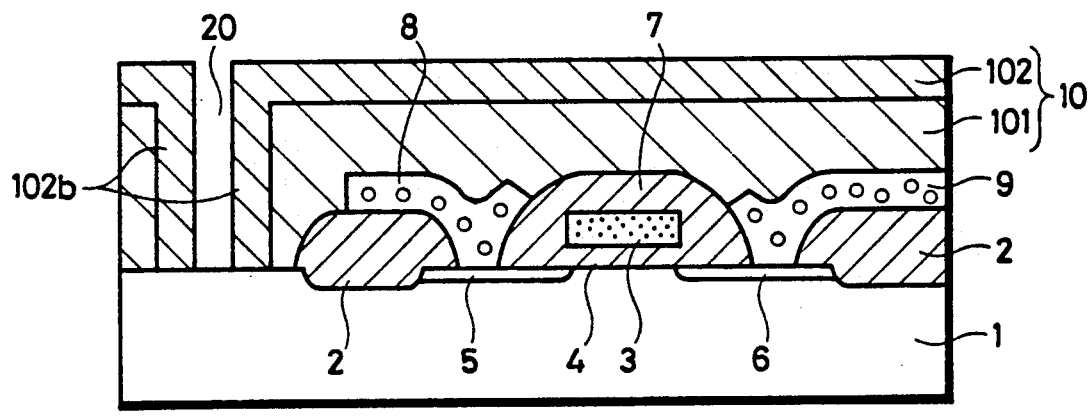

As shown in FIG. 6E, anisotropic etching is carried out on the silicon oxide films 102a and 102b by the thickness of 2000Å, that is, until the main surface of the silicon substrate 1 is exposed at the opening portion 20. Consequently, the silicon oxide film 102a on the second insulating layer 102 and the silicon oxide film formed on the main surface of the silicon substrate 1 in the opening portion 20 are removed. Consequently, the insulating layer 102b of silicon oxide film having the glass transition point of 1150° C. is formed only on the side wall portions of the opening portion 20.

Figure 6F:
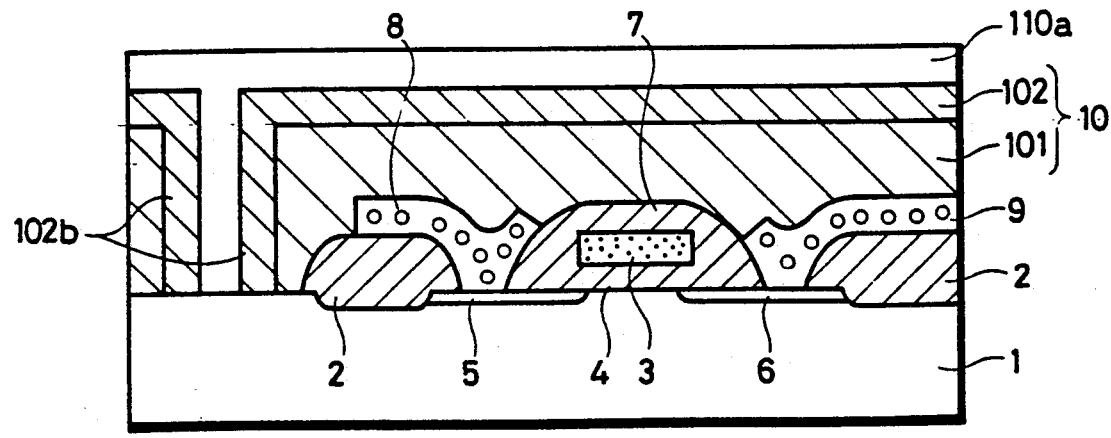

Referring to FIG. 6F, a polycrystalline silicon layer 110a is formed by the CVD method on the interlayer insulating film 10 so as to fill the opening portion 20.

Figure 6G:
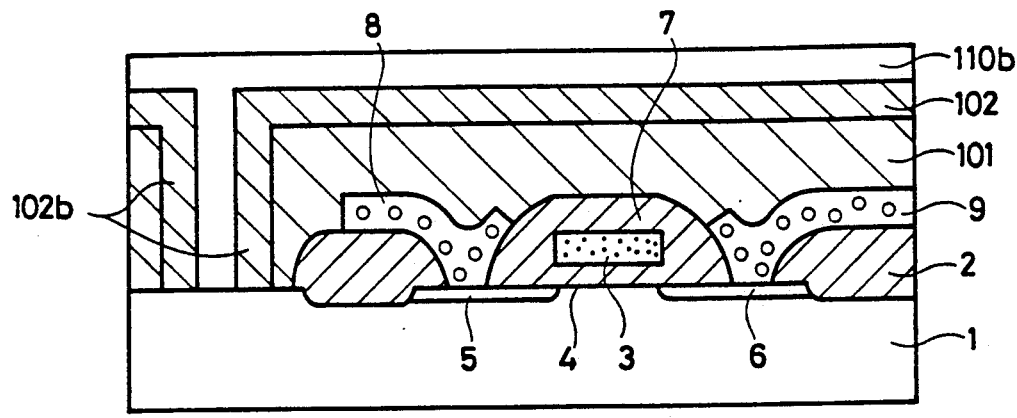

Thereafter, as shown in FIG. 6G, an energy line such as laser beam irradiates the polycrystalline silicon layer 110a, so that the polycrystalline silicon layer 110a is melt and recrystalized to be a single crystal silicon layer 110b. On this occasion, the recrystalization of the polycrystalline silicon starts from the portion directly below the opening portion 20 which is in contact with the silicon substrate 1, so that the crystallographic axis of the singlecrystal silicon layer 110b is the same as the crystallographic axis of the silicon substrate 1. Such method for making the crystallographic axis of the single crystal silicon the same as the crystallographic axis of the silicon substrate 1 while recrystalizing polycrystalline silicon to single crystal silicon comprises a method called lateral seeding.

Figure 6H:
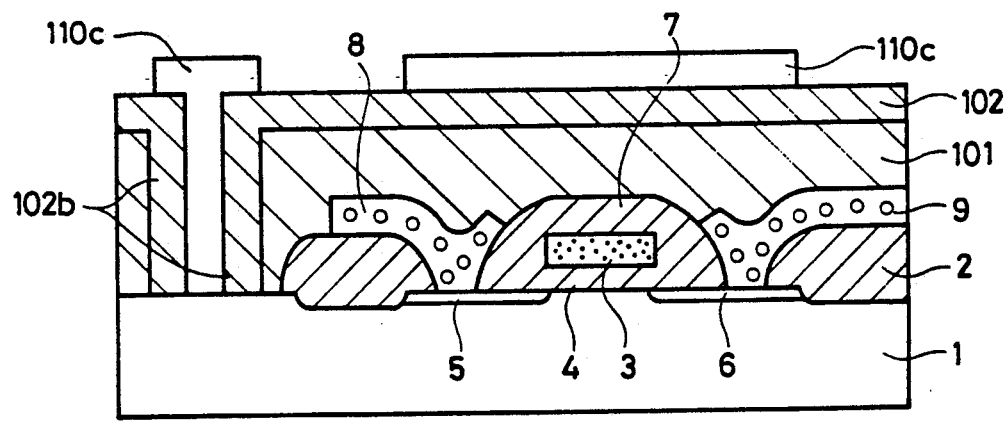

Thereafter, as shown in FIG. 6H, the polycrystalline silicon layer 110b is selectively removed to form an island-like polycrystalline silicon layer 110c.

Figure 6I:
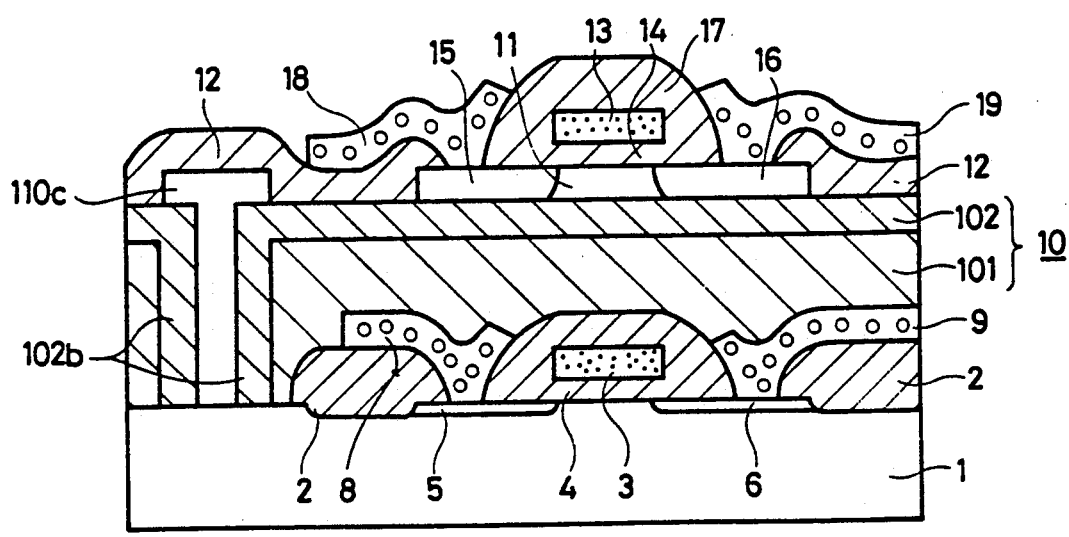

Referring to FIG. 6I, isolating regions 12 of silicon oxide film are formed to surround the upper semiconductor layer 11 which is the island-like polycrystalline silicon layer. Thermal processing is carried out at 900° C. for 10 min., thereby forming a gate insulating film 14 on the surface of the upper semiconductor layer 11. A gate electrode 13 is formed on the gate insulating film 14. Impurity diffused regions 15 and 16 serving as a pair of source and drain regions are formed by using the gate electrode 13 as a portion of a mask. The thermal diffusing process for forming the impurity diffused regions 15 and 16 is, for example, thermal processing at the temperature of 900° C. for 20 min. to the upper semiconductor layer 11. In this manner, the second layer MOS transistor is formed. An insulating layer 17 of silicon oxide film is formed to cover the gate electrode 13. The second interconnection layers 18 and 19 formed of, for example, aluminum are formed to be connected to the impurity diffused regions 15 and 16, respectively. Thus, the stacked type semiconductor device having the structure shown in FIG. 1 is provided.

Figure 7:
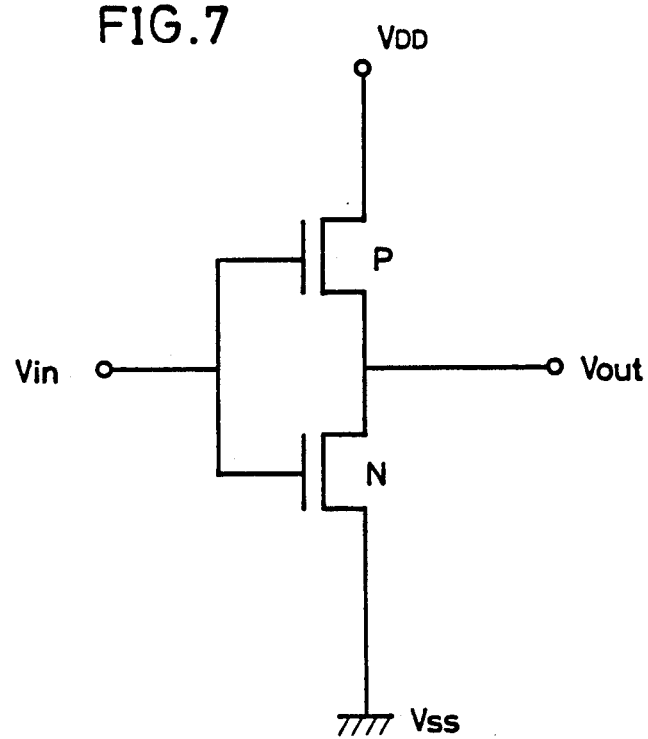
FIG. 7 is a circuit diagram showing an equivalent circuit of a CMOS inverter.
Figure 8:
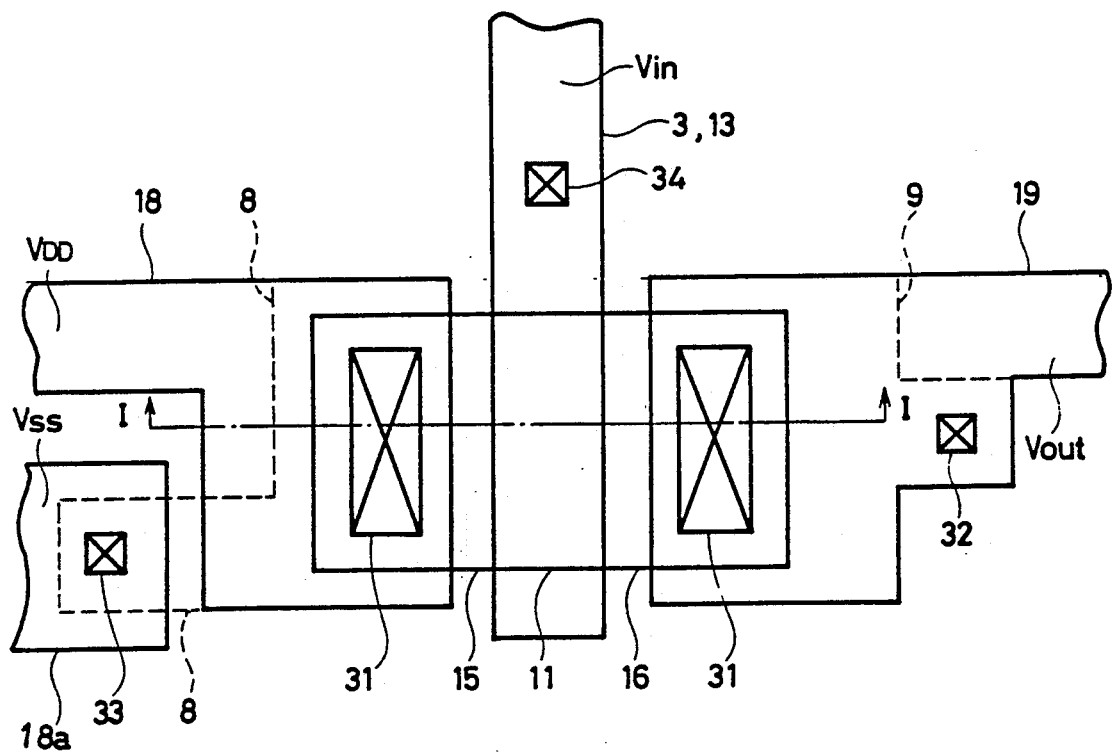
FIG. 8 is a partial plan view showing a planar layout of the CMOS inverter constituted by the stacked type semiconductor device of the present invention.
Figure 9:
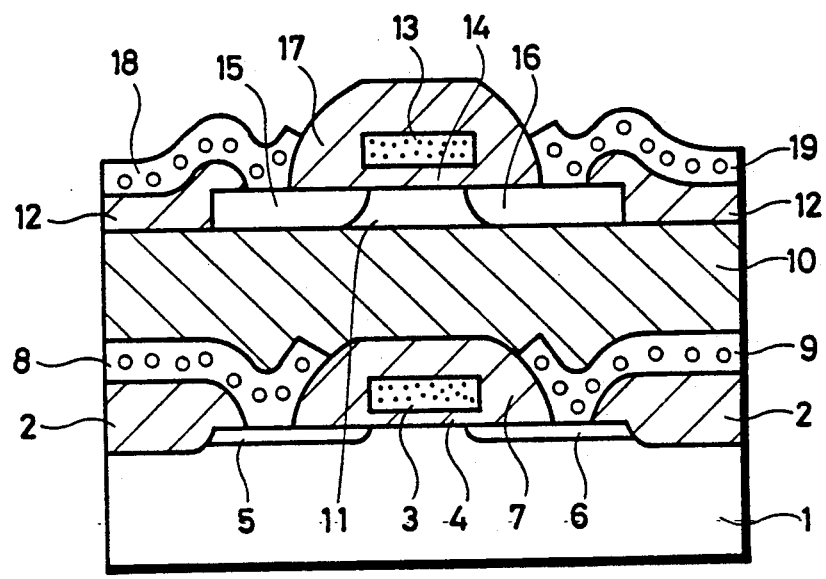
FIG. 9 is a partial sectional view showing a main portion of a conventional stacked type semiconductor device.

The stacked type semiconductor device having the structure shown in the above described embodiment may constitute a CMOS inverter. FIG. 7 is an equivalent circuit diagram of the CMOS inverter. FIG. 8 is a plan view showing a planar layout of the CMOS inverter. FIG. 1 corresponds to a cross section taken along the line I—I of FIG. 8. Referring to FIGS. 1, 7 and 8, an n channel MOS transistor is formed as the first layer MOS transistor and a P channel type MOS transistor is formed as the second layer MOS transistor. The silicon substrate 1 is p type while the upper semiconductor layer 11 is an n type single crystal silicon layer. The n type impurity diffused regions 5 and 6 constituting the first layer MOS transistor are formed to correspond to the p type impurity diffused regions 15 and 16 constituting the second layer MOS transistor. The gate electrode 3 of the first layer MOS transistor and the gate electrode 13 of the second layer MOS transistor are also formed to be overlapped with each other. The p type impurity diffused regions 15 and 16 constituting the second layer MOS transistor are connected to the second interconnection layer 18 serving as a $V_{DD}$ line and to the second interconnection layer 19 serving as a Vout line through contact holes 31, respectively. The second interconnection layer 19 is connected to the first interconnection layer 9 through a contact hole 32. The first interconnection layer 8 is connected to the second interconnection layer 18a serving as a $V_{SS}$ line through a contact hole 33. The gate electrode 3 of the n channel type MOS transistor as the first layer MOS transistor and the gate electrode 13 of the p channel type MOS transistor as the second layer MOS transistor are connected to a Vin line through a contact hole 34. In this manner, a CMOS inverter is formed by a stacked type semiconductor device.

Although the first insulating layer 101 of the interlayer insulating film is formed of VPSG film in the foregoing, it may be formed by a PSG film having the glass transition point of 750° C. Although the second insulating layer 102 is formed of a silicon oxide film in the above described embodiment, a silicon nitride film may be used.

Although a stacked type semiconductor device having two-layer structure has been described in the foregoing, it may comprise three or more layers. In such case, the same effect is provided when the interlayer insulating film comprising the first insulating layer 101 and the second insulating layer 102 shown in FIG. 1 is used as the interlayer insulating film between the second and third layers, the third and fourth layers, and so on.

As described above, according to the present invention, the first insulating layer suppresses stress remaining in the upper semiconductor layer derived from the difference between coefficient of thermal expansion of the upper semiconductor layer and the interlayer insulating film. The second insulating layer suppresses remaining distortion in the lateral direction generated in the upper semiconductor layer. Therefore, generation of distortion and cracks can be suppressed in the upper semiconductor layer formed on the interlayer insulating film. Consequently, a stacked type semiconductor device in which the semiconductor element formed on the upper semiconductor layer has superior characteristics can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A stacked type semiconductor device, comprising:
a first semiconductor layer having a main surface on which a first semiconductor element is formed;
an interlayer insulating film having a first insulating layer having a glass transition point of no higher than 750° C. formed on said first semiconductor element and a second insulating layer having a glass transition point higher than 750° C. and a thickness no less than 2000Å and no more than 1 μm formed on said first insulating layer; and
a second semiconductor layer formed on said second insulating layer of said interlayer insulating film with peripheral portions isolated to have an island-like shape, having a main surface on which a second semiconductor element is formed.

2. A stacked type semiconductor device according to claim 1, wherein
said first insulating layer comprises a silicon oxide film doped with boron and phosphorous, and said second insulating layer comprises a silicon oxide film.

3. A stacked type semiconductor device according to claim 1, wherein
said first semiconductor element comprises a field effect transistor having impurity regions of a second conductivity type formed spaced apart from each other in said first semiconductor layer so as to define a channel region having a portion of the main surface of said first semiconductor layer of a first conductivity type as a channel surface, and a gate electrode formed on said channel surface with an insulating film interposed therebetween.

4. A stacked type semiconductor device according to claim 3, wherein
said second semiconductor element comprises a field effect transistor having impurity regions of a first conductivity type formed spaced apart from each other in said second semiconductor layer so as to define a channel region having a portion of the main surface of said second semiconductor layer of a second conductivity type as a channel surface, and a gate electrode formed on said channel surface with an insulating film interposed therebetween.

* * * * *